United States Patent
Kitada et al.

(10) Patent No.: US 7,944,712 B2
(45) Date of Patent: May 17, 2011

(54) PLASMA DISPLAY DEVICE

(75) Inventors: Katsuhisa Kitada, Osaka (JP); Jumpei Hashiguchi, Kyoto (JP); Nobuyuki Matsui, Mie (JP); Etsuo Tsujimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 419 days.

(21) Appl. No.: 12/063,795

(22) PCT Filed: Aug. 8, 2006

(86) PCT No.: PCT/JP2006/315689
§ 371 (c)(1),
(2), (4) Date: Feb. 14, 2008

(87) PCT Pub. No.: WO2007/020842
PCT Pub. Date: Feb. 22, 2007

(65) Prior Publication Data
US 2009/0141462 A1   Jun. 4, 2009

(30) Foreign Application Priority Data

Aug. 16, 2005 (JP) ................. 2005-235993
Aug. 16, 2005 (JP) ................. 2005-235994

(51) Int. Cl.
H05K 7/02 (2006.01)
H05K 7/04 (2006.01)

(52) U.S. Cl. .......... 361/810; 361/807; 361/704

(58) Field of Classification Search .......... 361/807, 361/810, 752, 704, 714, 687
See application file for complete search history.

(56) References Cited

U.S. PATENT DOCUMENTS 6,833,674 B2 * 12/2004 Kaneko et al. ............. 313/587
7,164,586 B2 * 1/2007 Lin .............................. 361/714
7,457,120 B2 * 11/2008 Bae et al. .................... 361/704
2002/0159240 A1 10/2002 Watanabe et al.
2007/0188416 A1 8/2007 Inoue
2007/0195051 A1 8/2007 Ikeda
2007/0205964 A1 9/2007 Nagaki (Continued)

FOREIGN PATENT DOCUMENTS

JP    1-97984    4/1989

(Continued)

OTHER PUBLICATIONS

English language Abstract of JP 11-251772.

(Continued)

*Primary Examiner* — Hung S Bui
(74) *Attorney, Agent, or Firm* — Greenblum & Bernstein P.L.C.

(57) ABSTRACT

A PDP (plasma display panel) is attached to an electrically conductive board with a heat dissipation sheet sandwiched therebetween. A first driving circuit board is fixed on the electrically conductive board by a plurality of electrically conductive supports. On one surface, which faces the electrically conductive board, of the first driving circuit board, one or a plurality of electronic components are mounted, while a second driving circuit board is fixed. A plurality of support terminals of the second driving circuit board are connected to the first driving circuit board, and the first driving circuit board is attached to the electrically conductive board by the electrically conductive supports. Thus, one surface of the second driving circuit board is in contact with the electrically conductive board. One or a plurality of surface mount components are mounted on the other surface of the second driving circuit board that faces the first driving circuit board.

6 Claims, 12 Drawing Sheets

U.S. PATENT DOCUMENTS

| | | |
|---|---|---|
| 2007/0222902 A1 | 9/2007 | Yamate |
| 2007/0258199 A1* | 11/2007 | Jeong .......................... 361/681 |
| 2007/0268216 A1 | 11/2007 | Arai et al. |

FOREIGN PATENT DOCUMENTS

| | | |
|---|---|---|
| JP | 2-7081 | 1/1990 |
| JP | 9-306632 | 11/1997 |
| JP | 11-251772 | 9/1999 |
| JP | 11-284379 | 10/1999 |
| JP | 2001-339186 | 12/2001 |
| JP | 2002-302188 | 10/2002 |
| JP | 2004-182607 | 7/2004 |

OTHER PUBLICATIONS

English language Abstract of JP 1-97984.
English language Abstract of JP 9-306632.
English language Abstract of JP 11-284379.
English language Abstract of JP 2002-302188.
English language Abstract of JP 2-7081.
English language partial translation of JP 1-97984.
English language partial translation of JP 11-251772.
English language partial translation of JP 9-306632.
English language partial translation of JP 11-284379.
English language partial translation of JP 2-7081.
Japanese Office Action that issued with respect to Japanese Patent Application No. 2007-530957, mailed Dec. 14, 2010.

* cited by examiner

F I G. 8
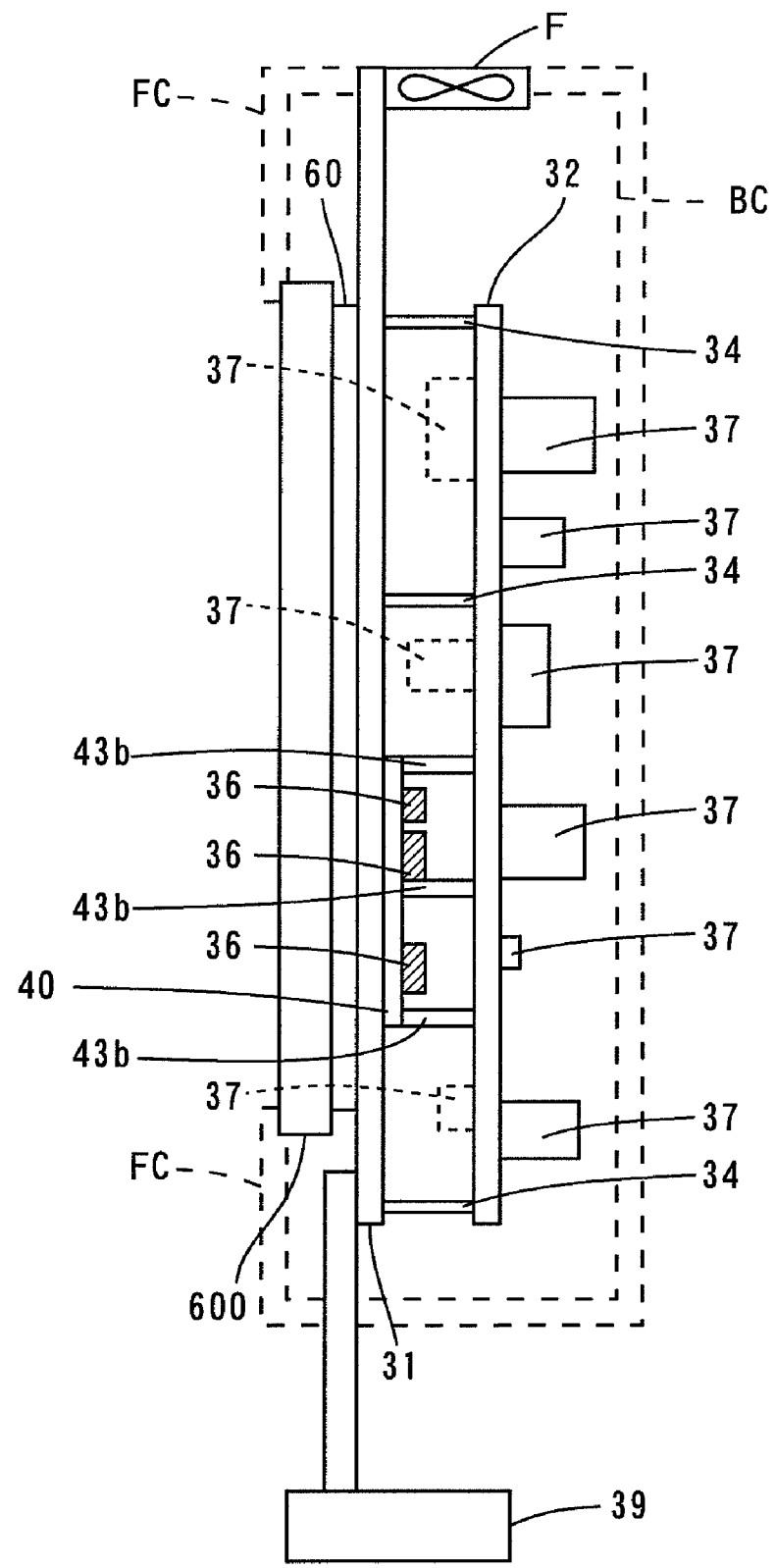

PLASMA DISPLAY DEVICE

TECHNICAL FIELD

The present invention relates to a plasma display device using a plasma display panel.

BACKGROUND ART

Plasma display devices using plasma display panels as self-emission image displays have the advantage that thinning and larger screens are possible. Such a plasma display device displays images by utilizing light emissions at the time of discharges of discharge cells that compose pixels.

The above-mentioned plasma display device is mainly composed of a plasma display panel, an aluminum plate holding the plasma display panel and a circuit board attached to the aluminum plate (see Patent Document 1, for example). A plurality of electronic components are mounted on the above-mentioned circuit board.

In the plasma display device described in Patent Document 1, one surface of the circuit board has the plurality of electronic components, and the other surface of the circuit board is joined to the aluminum plate with a thermal conduction sheet sandwiched therebetween.

Here, a configuration of the plasma display panel is schematically described.

FIG. 12 is a schematic view showing the configuration of the plasma display panel of the plasma display device.

As shown in FIG. 12, a plurality of rows of display electrodes 2 each composed of a pair of scan electrode and sustain electrode are formed on a substrate 1 made of a transparent glass substrate or the like on the front side of the plasma display panel. A dielectric layer 3 is formed so as to cover the plurality of display electrodes 2, and a protective film 4 is formed on the dielectric layer 3.

On a substrate 5, which is arranged so as to face the substrate 1 on the front side, on the back side of the plasma display device, a plurality of rows of address electrodes 7 with an overcoat layer 6 covered thereon are formed so as to intersect with the display electrodes 2.

A plurality of barrier ribs 8 are provided in parallel with the address electrodes 7 on the surface of the overcoat layer 6 that is provided between the address electrodes 7, and phosphor layers 9 are provided on side surfaces of the barrier ribs 8 and on the overcoat layer 6.

The above-described substrate 1 and substrate 5 are arranged to face each other such that each of the display electrodes 2 and each of the address electrodes 7 are substantially perpendicular to each other and a discharge space is formed therebetween while the periphery thereof is sealed. One or two or more kinds of helium, neon, argon and xenon are filled in the above-mentioned discharge space as discharge gases.

The foregoing discharge space is separated into a plurality of sections by the barrier ribs 8, so that a plurality of discharge cells are formed. The red, green and blue phosphor layers 9 are provided in each of the discharge cells.

In the plasma display panel having the foregoing configuration, write pulses are applied between the address electrodes 7 and the scan electrodes, so that address discharges are induced between the address electrodes 7 and the scan electrodes.

Periodical sustain pulses that alternately invert are applied between the scan electrodes and the sustain electrodes after the discharge cells are selected, so that sustain discharges are induced between the scan electrodes and the sustain electrodes, thereby displaying a predetermined pattern.

[Patent Document 1] JP 11-284379 A

DISCLOSURE OF THE INVENTION

Problems to be Solved by the Invention

In a conventional plasma display device, heat generated by a plurality of electronic components mounted on a circuit board is dissipated through an aluminum plate via the circuit board and a thermal conduction sheet. However, since the thermal conductive property of the circuit board is not high enough, the heat generated by the electronic components on the circuit board is not sufficiently dissipated.

Specifically, it is necessary and inevitable to ensure sufficient heat dispassion when the number of the electronic components mounted on the circuit board is large or when the electronic components have the high heat-generating properties.

Means for Solving the Problems

An object of the present invention is to provide the plasma display device capable of ensuring sufficient heat dissipation.

(1)

According to an aspect of the present invention, a plasma display device includes a plasma display panel, a supporting board that supports the plasma display panel, a first driving circuit board having a first surface and a second surface, a coupling member that couples the supporting board and the first driving circuit board with each other and is positioned between one surface of the supporting board and the first surface of the first driving circuit board, a second driving circuit board that is arranged on the supporting board and positioned between the supporting board and the first driving circuit board, and one or plurality of driving circuits that are mounted on the first and second driving circuit boards and supply drive currents to the plasma display panel.

In the plasma display device, the plasma display panel is supported by the supporting board. In addition, the supporting board and the first driving circuit board are coupled with each other by the coupling member that is positioned between the one surface of the supporting board and the first surface of the first driving circuit board. The second driving circuit board is arranged on the supporting board and positioned between the supporting board and the first driving circuit board. The driving circuits mounted on the first and second driving circuit boards supply the drive currents to the plasma display panel.

In such a configuration, at least part of the one or plurality of driving circuits is mounted on the second driving circuit board arranged on the supporting board, so that heat generated by the one or plurality of driving circuits is efficiently transmitted to the supporting board. Accordingly, heat dissipation from the one or plurality of driving circuits is improved, and sufficient heat dissipation from the plasma display device is ensured.

(2)

The plasma display device may further include an electrically conductive connecting member that connects the first and second driving circuit boards to each other such that the first driving circuit board and the second driving circuit board face each other.

In this case, the connecting member is used as a wiring and a terminal of the one or plurality of driving circuits mounted on the second driving circuit board while being used as a member for connecting the first driving circuit board and the second driving circuit board to each other.

As described above, a common member electrically and mechanically connects the first driving circuit board and the second driving circuit board, thereby reducing the number of components and simplifying the configuration.

(3)

The connecting member may have a plurality of openings. In this case, the connecting member is easily processed. This allows the plasma display device to be easily manufactured. Moreover, the heat generated by the one or plurality of driving circuits mounted on the second driving circuit board is radiated through the plurality of openings. Thus, heat dissipation from the one or plurality of driving circuits is improved.

(4)

The plasma display panel, the supporting board, the first driving circuit board and the second driving circuit board may be arranged along a substantially vertical direction, the connecting member may include a plurality of connecting members, and the plurality of connecting members may be arranged so as to align in a vertical direction.

As described above, the plasma display panel, the supporting board, the first driving circuit board and the second driving circuit board are arranged along the substantially vertical direction, so that the atmosphere heated by the one or plurality of driving circuits mounted on the second driving circuit board goes up in a space between the supporting board and the first driving circuit board.

The plurality of connecting members are arranged so as to align in the vertical direction, so that the high-temperature atmosphere can smoothly go up without being disturbed by the plurality of connecting members. This can ensure further sufficient heat dissipation from the plasma display device.

(5)

The second driving circuit board may be arranged at a part lower than a center of the plasma display panel. In this case, the high-temperature atmosphere heated by the one or plurality of driving circuits mounted on the second driving circuit board goes up in the space between the supporting board and the first driving circuit board from the part lower than the center of the plasma display panel. This generates an upward airflow from below in the plasma display device. As a result, further sufficient heat dissipation from the plasma display device is ensured.

(6)

The plasma display device may further include an airflow forming device that forms an airflow between the supporting board and the first driving circuit board. In this case, the airflow forming device forms the airflow between the supporting board and the first driving circuit board. As a result, further sufficient heat dissipation from the plasma display device is ensured.

(7)

The plasma display device may further include a heat dissipation member between the plasma display panel and the supporting board. In this case, heat dissipation from the one or plurality of driving circuits is more improved.

(8)

The plasma display device may further include a thermal conductive member between the supporting board and the second driving circuit board. In this case, heat dissipation from the one or plurality of driving circuits is further improved.

(8-a)

The one or plurality of driving circuits may include a transistor. In this case, also when a switching device having the high heat-generating property such as the transistor is used, sufficient heat dissipation therefrom is ensured.

(8-b)

The plasma display device may further include at least one of a diode and a transformer provided on the second driving circuit board. In this case, also when a component having the high heat-generating property such as the diode and the transformer is used, sufficient heat dissipation therefrom is ensured.

(8-c)

The plasma display device may further include an electronic component provided on one or both of the first and second surfaces of the first driving circuit board. In this case, since the one or plurality of driving circuits are mounted on the second driving circuit board arranged on the supporting board, a mounting region, provided on one or both of the first and second surfaces of the first driving circuit board, for the electronic component is enlarged.

Larger spacing between the electronic components provided on one or both of the first and second surfaces of the first driving circuit board improves heat dissipation from the electronic components. On the other hand, smaller spacing between the electronic components provided on one or both of the first and second surfaces of the first driving circuit board achieves size reduction of the first driving circuit board.

Thus, the size of the first driving circuit board and spacing between the electronic components are appropriately set, so that size reduction of the first driving circuit board and improvement of heat dissipation from the electronic components are achieved.

(9)

The one or plurality of driving circuits may be provided in a region, which faces the second driving circuit board, on the first surface of the first driving circuit board. Accordingly, the mounting region for the electronic components on the first driving circuit board is enlarged.

Larger spacing between the electronic components on the first driving circuit board further improves heat dissipation from the electronic components. On the other hand, smaller spacing between the electronic components on the first driving circuit board achieves further size reduction of the first driving circuit board.

Thus, the size of the first driving circuit board and the spacing between the electronic components are appropriately set, so that further size reduction of the first driving circuit board and further improvement of heat dissipation from the electronic components are achieved.

(10)

According to another aspect of the present invention, a plasma display device includes a plasma display panel including a scan electrode and a sustain electrode, a supporting board that supports the plasma display panel, a first scan driving circuit board having a first surface and a second surface, a first sustain driving circuit board having a third surface and a fourth surface, a first coupling member that couples the supporting board and the first scan driving circuit board with each other and is positioned between the supporting board and the first surface of the first scan driving circuit board, a second coupling member that couples the supporting board and the first sustain driving circuit board with each other and is positioned between the supporting board and the third surface of the first sustain driving circuit board, a second scan driving circuit board that is provided on the supporting board and is positioned between the supporting board and the first scan driving circuit board, a second sustain driving circuit board that is provided on the supporting board and is positioned between the supporting board and the first sustain driving circuit board, one or plurality of first driving circuits that are mounted on the first and second scan driving circuit boards and supply drive currents to the scan electrode of the plasma display panel, and one or plurality of second driving circuits that are mounted on the first and second sustain driving circuit boards and supply the drive currents to the sustain electrode of the plasma display panel.

In the plasma display device, the plasma display panel is supported by the supporting board. In addition, the supporting board and the first scan driving circuit board are coupled with each other by the first coupling member that is positioned between the one surface of the supporting board and the first surface of the first scan driving circuit board. Furthermore, the supporting board and the first sustain driving circuit board are coupled with each other by the second coupling member that is positioned between the one surface of the supporting board and the third surface of the first sustain driving circuit board.

The second scan driving circuit board is arranged on the supporting board and is positioned between the supporting board and the first scan driving circuit board. The one or plurality of first driving circuits mounted on the first and second scan driving circuit boards supply the drive currents to the plasma display panel.

In such a configuration, at least part of the one or plurality of first driving circuits is mounted on the second scan driving circuit board arranged on the supporting board, so that the heat generated by the one or plurality of first driving circuits is efficiently transmitted to the supporting board. This improves heat dissipation from the one or plurality of first driving circuits and ensures sufficient heat dissipation from the plasma display device.

The second sustain driving circuit board is arranged on the supporting board and positioned between the supporting board and the first sustain driving circuit board. The one or plurality of second driving circuits mounted on the first and second sustain driving circuit boards supply the drive currents to the plasma display panel.

In such a configuration, at least part of the one or plurality of second driving circuits is mounted on the second sustain driving circuit board arranged on the supporting board, so that the heat generated by the one or plurality of second driving circuits is efficiently transmitted to the supporting board. This improves heat dissipation from the one or plurality of second driving circuits and ensures sufficient heat dissipation from the plasma display device.

(11)

According to still another aspect of the present invention, a plasma display device includes a plasma display panel, a supporting board that supports the plasma display panel, a driving circuit board, to which one or plurality of driving circuits supplying drive currents to the plasma display panel are mounted, having first and second surfaces, and a joining member that joins the supporting board and the driving circuit board and is positioned between the supporting board and the first surface of the driving circuit board, wherein at least part of the one or plurality of driving circuits is provided on the first surface of the driving circuit board.

In the plasma display device, the plasma display panel is supported by the supporting board. In addition, the driving circuit on the driving circuit board supplies the drive current to the plasma display panel. Moreover, the supporting board and the driving circuit board are joined to each other by the joining member that is positioned between the supporting board and the first surface of the driving circuit board.

In such a configuration, at least part of the one or plurality of driving circuits is provided on the first surface of the driving circuit board, so that the heat from the one or plurality of driving circuits is sufficiently dissipated through the supporting board.

(12)

The one or plurality of driving circuits that are provided on the first surface of the driving circuit board may be in contact with or in proximity to the supporting board. In this case, the heat generated by the one or plurality of driving circuits is reliably dissipated through the supporting board.

(12-a) The plasma display device may further include a heat dissipation member between the plasma display panel and the supporting board. In this case, heat dissipation from the one or plurality of driving circuits is further improved.

(13)

The plasma display device may further include a thermal conductive member between the supporting board and the first surface of the driving circuit board. In this case, heat dissipation from the one or plurality of driving circuits is further improved.

(13-a)

The one or plurality of driving circuits may include a transistor. In this case, also when a switching device having the high heat-generating property such as the transistor is used, sufficient heat dissipation therefrom is ensured.

(13-b)

The plasma display device may further include at least one of a diode and a transformer provided on the first surface of the driving circuit board. In this case, also when a component having the high heat-generating property such as the diode and the transformer is used, sufficient heat dissipation therefrom is ensured.

(13-c)

The plasma display device may further include an electronic component provided on the second surface of the driving circuit board. The one or plurality of driving circuits are provided on the first surface of the driving circuit board, so that a region for arrangement of the electronic components provided on the second surface of the driving circuit board is enlarged.

(13-d)

The electronic component may include at least one of an integrated circuit, a coil, a resistor, a variable resistor, a transistor, a capacitor, an inductor, a transformer and a photocoupler. The one or plurality of driving circuits are provided on the first surface of the driving circuit board, so that the region for arrangement of the integrated circuit, the coil, the resistor, the variable resistor, the transistor, the capacitor, the inductor, the transformer and the photocoupler provided on the second surface of the driving circuit board is enlarged.

(14)

According to yet another aspect of the present invention, a plasma display device includes a plasma display panel including a scan electrode and a sustain electrode, a supporting board that supports the plasma display panel, a first driving circuit board to which one or plurality of first driving circuits supplying drive currents to the scan electrode of the plasma display panel are mounted, having first and second surfaces, a second driving circuit board to which one or plurality of second driving circuits supplying the drive currents to the sustain electrode of the plasma display panel are mounted, having third and fourth surfaces, and joining members that join the supporting board and the first driving circuit board and join the supporting board and the second driving circuit board, respectively, and are positioned between the supporting board and the first surface of the first driving circuit board and between the supporting board and the third surface of the second driving circuit board, respectively, wherein at least part of the first driving circuits of the first driving circuit board is provided on the first surface of the first driving circuit board, and at least part of the one or plurality of second driving circuits of the second driving circuit board is provided on the third surface of the second driving circuit board.

In the plasma display device, the plasma display panel including the scan electrode and the sustain electrode is supported by the supporting board. In addition, the first and second driving circuits of the first and second driving circuit boards supply the drive current to the plasma display panel, respectively. Moreover, each of the first and second driving circuit boards is joined to the supporting board by each of the joining members that are positioned between the supporting board and the first surfaces of the first and second driving circuit boards, respectively.

In such a configuration, at least part of the one or plurality of first driving circuits is provided on the first surface of the first driving circuit board, and at least part of the one or plurality of second driving circuits is provided on the third surface of the second driving circuit board, so that the heat from the respective one or plurality of first and second driving circuits is sufficiently dissipated through the supporting board.

(15)

The one or plurality of first driving circuits provided on the first surface of the first driving circuit board may be in contact with or in proximity to the supporting board, and the one or plurality of second driving circuits provided on the third surface of the second driving circuit board may be in contact with or in proximity to the supporting board.

In this case, the heat from the respective one or plurality of first and second driving circuits is reliably dissipated through the supporting board.

Effects Of The Invention

In a plasma display device according to the present invention, a plasma display panel is supported by a supporting board. A coupling member positioned between one surface of the supporting board and a first surface of a first driving circuit board couples the supporting board and the first driving circuit board with each other. A second driving circuit board is arranged on the supporting board and positioned between the supporting board and the first driving circuit board. Driving circuits mounted on the first and second driving circuit boards supply drive currents to the plasma display panel.

In such a configuration, at least part of the one or plurality of driving circuits is mounted on the second driving circuit board arranged on the supporting board, so that heat generated by the one or plurality of driving circuits is efficiently transmitted to the supporting board. Thus, heat dissipation from the one or plurality of driving circuits is improved, thereby ensuring sufficient heat dissipation from the plasma display device.

In addition, according to the present invention, at least part of the one or plurality of driving circuits is provided on the first surface of the driving circuit board, so that heat generated by the one or plurality of driving circuits is sufficiently dissipated through the supporting board.

BRIEF DESCRIPTION OF THE DRAWINGS

FIG. 8 is a side view showing a plasma display device according to a third embodiment.

BEST MODE FOR CARRYING OUT THE INVENTION

Figure 1:
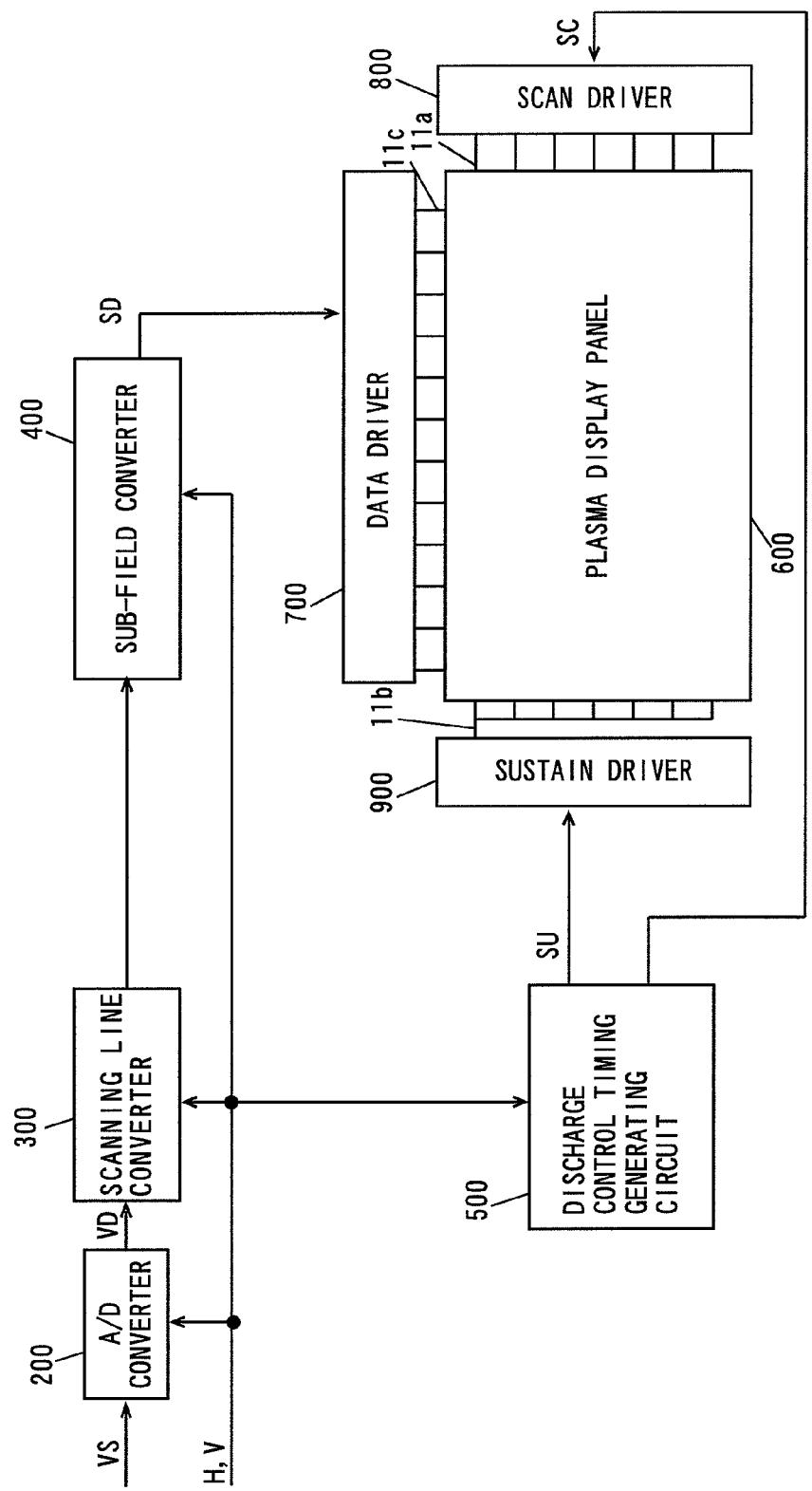
FIG. 1 is a block diagram showing a configuration of a plasma display device according to a first embodiment.

The embodiments of the present invention will be described in detail referring to the drawings. The embodiments below describe a plasma display device.

(1) First Embodiment (1-a) Configuration of Plasma Display Device

FIG. 1 is a block diagram showing a configuration of a plasma display device according to a first embodiment.

As shown in FIG. 1, the plasma display device includes an A/D converter (analog-to-digital converter) 200, a scanning line converter 300, a sub-field converter 400, a discharge control timing generating circuit 500, a plasma display panel (PDP) 600, a data driver 700, a scan driver 800 and a sustain driver 900.

A video signal VS is input to the A/D converter 200. In addition, a horizontal synchronizing signal H and a vertical synchronizing signal V are applied to the discharge control timing generating circuit 500, the A/D converter 200, the scanning line converter 300 and the sub-field converter 400.

The A/D converter 200 converts the video signal VS into digital image data VD, and applies the image data VD to the scanning line converter 300.

The scanning line converter 300 converts the image data VD into image data on lines whose number corresponds to the number of pixels in the PDP 600, and applies the image data for each of the lines to the sub-field converter 400. The image data for each of the lines is composed of a plurality of pixel data corresponding to the plurality of pixels for the line, respectively.

The sub-field converter 400 converts each of the pixel data composing the image data for each of the lines into serial data SD corresponding to a plurality of sub-fields, and applies the serial data SD to the data driver 700.

The discharge control timing generating circuit 500 generates discharge control timing signals SC, SU using the horizontal synchronizing signal H and the vertical synchronizing signal V as a basis. The discharge control timing generating circuit 500 applies the discharge control timing signal SC to the scan driver 800, and applies the discharge control timing signal SU to the sustain driver 900.

The PDP 600 includes a plurality of data electrodes 11c, a plurality of scan electrodes 11a and a plurality of sustain electrodes 11b. The plurality of data electrodes 11c are arranged in a vertical direction on a screen, and the plurality of scan electrodes 11a and the plurality of sustain electrodes 11b are arranged in a horizontal direction on the screen. The plurality of sustain electrodes 11b are connected to one another.

A discharge cell is formed at each intersection of the data electrodes 11c, the scan electrodes 11a and the sustain electrodes 11b. Each discharge cell forms the pixel on the screen.

The data driver 700 converts the serial data SD applied from the sub-field converter 400 into parallel data, and selectively applies write pulses to the plurality of data electrodes 11c based on the parallel data.

The scan driver 800 drives each of the scan electrodes 11a based on the discharge control timing signal SC applied from the discharge control timing generating circuit 500. The sustain driver 900 drives the sustain electrodes 11b based on the discharge control timing signal SU applied from the discharge control timing generating circuit 500.

An ADS (Address Display-Period Separation) system as a gray scale expression driving system can be employed in the plasma display device shown in FIG. 1.

(1-b) Operation of the Plasma Display Device

Figure 2:
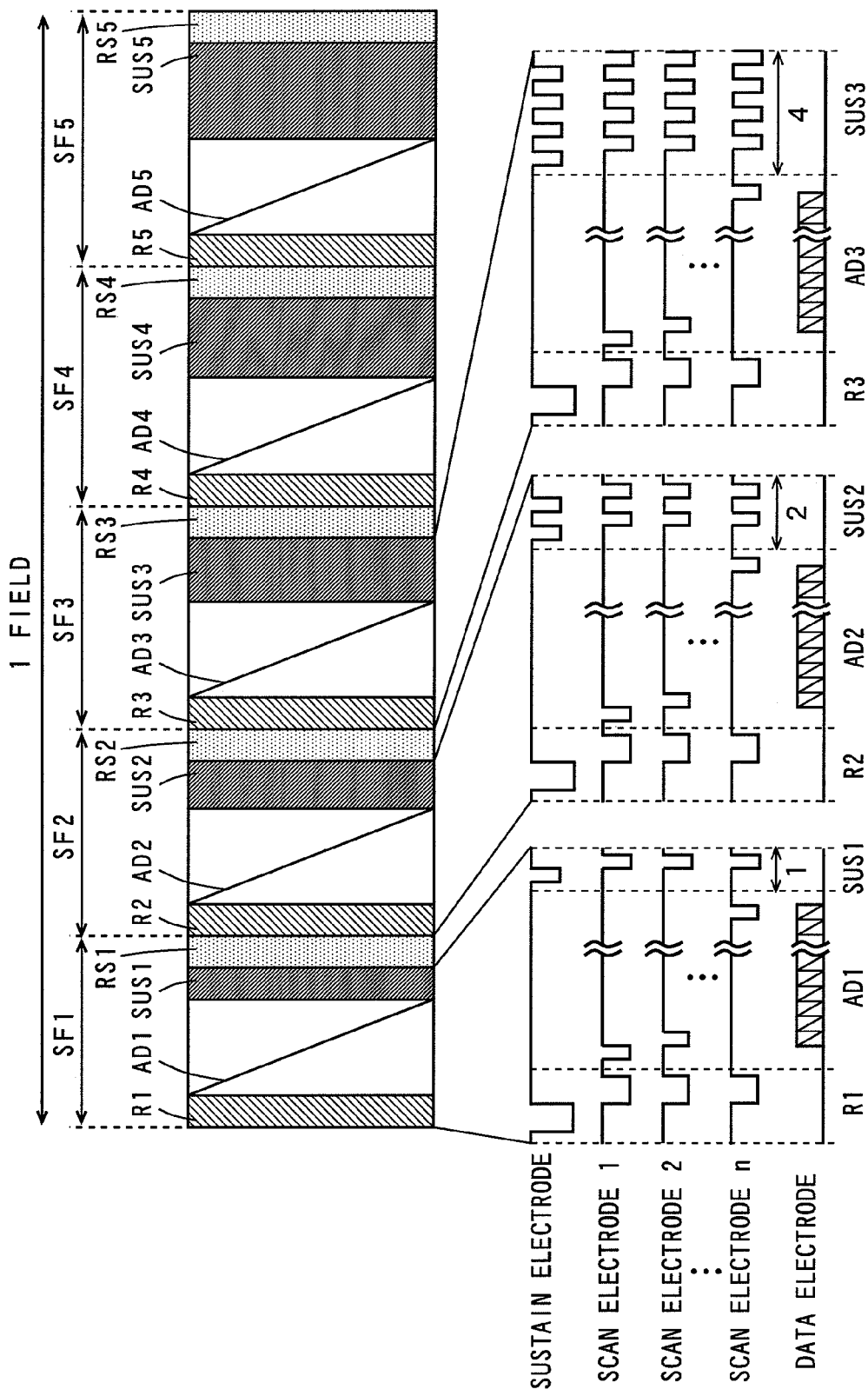
FIG. 2 is a diagram for explaining an ADS system applied in the plasma display device shown in FIG. 1.

FIG. 2 is a diagram for explaining the ADS system applied in the plasma display device shown in FIG. 1. Although FIG. 2 shows an example of negative pulses that cause discharges during the fall time of drive pulses, basic operations shown below apply similarly to the case of positive pulses that cause the discharges during the rise time.

In the ADS system, one field is temporally divided into the plurality of sub-fields. For example, the one field is divided into five sub-fields SF1-SF5. Moreover, the sub-fields SF1-SF5 are separated into initialization periods R1-R5, write periods AD1-AD5, sustain periods SUS1-SUS5 and erase periods RS1-RS5. An initialization process for each of the sub-fields is performed in each of the initialization periods R1-R5, an address discharge is generated for selecting a discharge cell or cells to be illuminated in each of the write periods AD1-AD5, and a sustain discharge is generated for display in each of the sustain periods SUS1-SUS5.

In each of the initialization periods R1-R5, a single initialization pulse is applied to the sustain electrodes 11b, and a single initialization pulse is applied to each of the scan electrodes 11a. This generates a preliminary discharge.

In each of the write periods AD1-AD5, the scan electrodes 11a are sequentially scanned, and a predetermined write process is performed only to the discharge cell or cells that have received the write pulse from the data electrodes 11c. This generates the address discharge.

In each of the sustain periods SUS1-SUS5, a sustain pulse or pulses corresponding to a value with which each of the sub-fields SF1-SF5 is weighted are output to the sustain electrodes 11b and the scan electrodes 11a. For example, in the sub-field SF1, one sustain pulse is applied to the sustain electrodes 11b, one sustain pulse is applied to the scan electrodes 11a, and in the write period causing two sustain discharges in the selected discharge cell or cells. In the sub-field SF2, two sustain pulses are applied to the sustain electrodes 11b, two sustain pulses are applied to the scan electrodes 11a, and in the write period, causing four sustain discharges in the selected discharge cell or cells.

As described above, in the sub-fields SF1-SF5, one, two, four, eight, and sixteen sustain pulses, respectively, are applied to the sustain electrodes 11b and the scan electrodes 11a, causing the discharge cells to emit light at the brightness (luminance) corresponding to the respective numbers of pulses. In other words, the sustain periods SUS1-SUS5 are periods in which the discharge cells selected in the respective write periods AD1-AD5 discharge at the number of times corresponding to the respective weights of brightness.

(1-c) The Configuration of the Plasma Display Device

Figure 3:
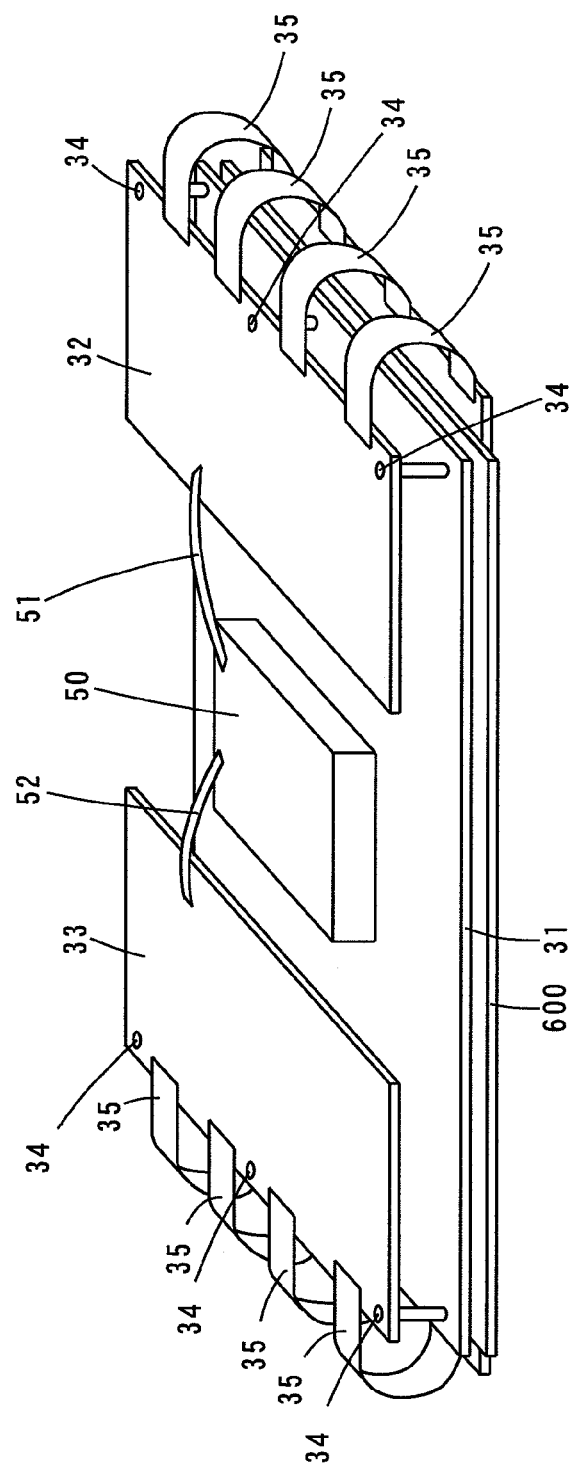
FIG. 3 is a perspective view showing the appearance of the plasma display device according to the first embodiment.

FIG. 3 is a perspective view showing the appearance of the plasma display device according to the first embodiment.

As shown in FIG. 3, an electrically conductive board (panel support) 31 made of, for example, aluminum, steel or the like is bonded to the PDP 600 with a heat dissipation sheet (shown in a diagram described later) sandwiched therebetween. Note that the PDP 600 includes the plurality of scan electrodes 11a and the plurality of sustain electrodes 11b of FIG. 1.

First driving circuit boards 32, 33 are fixed on the electrically conductive board 31 by a respective plurality of electrically conductive supports (bosses) 34. Note that various kinds of surface mount components and various kinds of electronic components, described later, to be mounted on surfaces of the first driving circuit boards 32, 33 are not shown in FIG. 3. Moreover, second driving circuit boards, described later, to be attached to the first driving circuit boards 32, 33 are not shown in FIG. 3.

The first driving circuit boards 32, 33 are connected to the scan electrodes 11a and the sustain electrodes 11b of the PDP 600, respectively, by a respective plurality of flexible connection boards 35 as wiring boards.

A power supply circuit 50 and a fan, which is not shown, are provided on the electrically conductive board 31. The power supply circuit 50 is connected to the first driving circuit board 32 by a wiring member 51 while being connected to the first driving circuit board 33 by a wiring member 52.

Next, the various kinds of surface mount components and the various kinds of electronic components mounted on the surfaces of the first driving circuit boards 32, 33 and the second driving circuit boards attached to the first driving circuit boards 32, 33 are explained.

Figure 4:
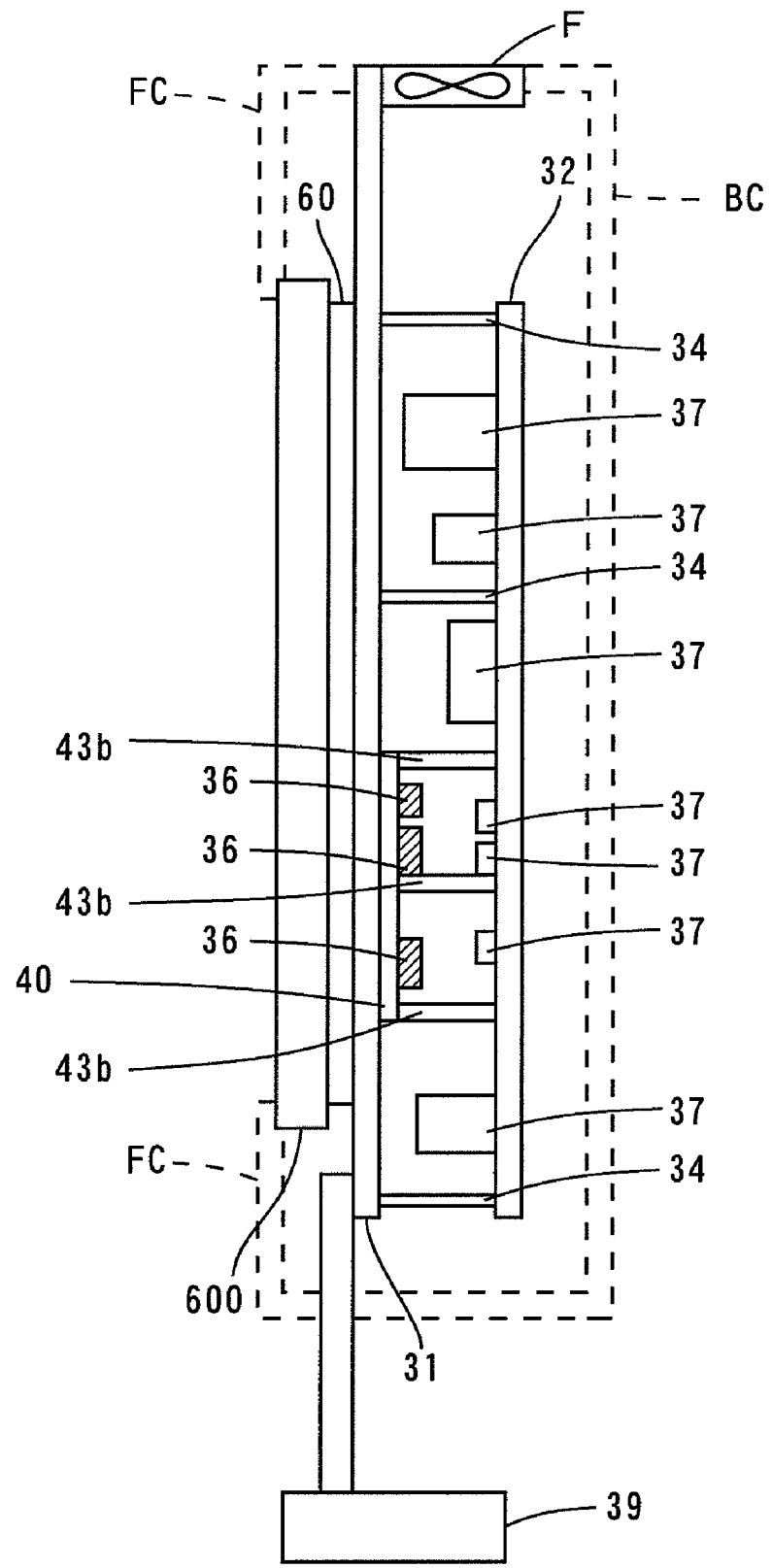
FIG. 4 is a side view showing the plasma display device of FIG. 3.

FIG. 4 is a side view showing the plasma display device of FIG. 3. Note that in FIG. 4, the plasma display device that is seen from the side of the first driving circuit board 32 is shown, and a part thereof is omitted. While configurations of the first driving circuit board 32 and the second driving circuit board attached thereto are explained as one typical example in the following, configurations of the first driving circuit board 33 and the second driving circuit board attached thereto are similar to the configurations of the first driving circuit board 32 and the second driving circuit board attached thereto.

As shown in FIG. 4, the PDP 600 is attached to the electrically conductive board 31 with the heat dissipation sheet 60 sandwiched therebetween. The first driving circuit board 32 is fixed on the electrically conductive board 31 by the plurality of electrically conductive supports 34 as described above. Spacing between the first driving circuit board 32 and the electrically conductive board 31 is 10-25 mm, for example.

On one surface, which faces the electrically conductive board 31, of the first driving circuit board 32, one or plurality of electronic components 37 are mounted while the second driving circuit board 40 is fixed in the present embodiment.

The second driving circuit board 40 has a plurality of support terminals 43b. The plurality of support terminals 43b have substantially the same heights as the spacing between the electrically conductive board 31 and the first driving circuit board 32. The plurality of support terminals 43b function as supporting members for the second driving circuit board 40 while functioning as wirings and terminals of surface mount components 36 described later. Details will be described later.

In assembly of the plasma display device, the plurality of support terminals 43b of the second driving circuit board 40 are connected to the first driving circuit board 32, and the first driving circuit board 32 is attached to the electrically conductive board 31 by the electrically conductive supports 34. Thus, one surface of the second driving circuit board 40 is brought into contact with the electrically conductive board 31.

The one or plurality of surface mount components 36 are mounted on the other surface, which faces the first driving circuit board 32, of the second driving circuit board 40.

The surface mount components 36 have high heat-generating properties, and include, for example, a bipolar transistor, a field-effect transistor (FET), an insulated gate bipolar transistor (IGBT), a diode, a small-sized transformer or the like. As for the various kinds of surface mount components 36 described above, a collector fin of the bipolar transistor or the insulated gate bipolar transistor (IGBT), a drain fin of the field-effect transistor (FET) or a cathode fin of the diode, for example, is bonded to the other surface of the second driving circuit board 40 with a solder while a terminal thereof is connected to a conductor layer (wiring pattern), described later, of the second driving circuit board 40 with the solder. The heights of the surface mount components 36 are about not more than 10 mm, for example.

The electronic components 37 mounted on the first driving circuit board 32 have the heat-generating properties relatively lower than those of the surface mount components 36. The electronic components 37 include, for example, an integrated circuit, a coil, a resistor, a variable resistor, a small-signal transistor, a capacitor, an inductor, a transformer, a photocoupler or the like.

The electronic components 37 have heights lower than the support terminals 43b of the second driving circuit board 40 (about not more than 10-25 mm, for example). It is also possible to mount the electronic components 37 on the one surface of the first driving circuit board 32 that faces the second driving circuit board 40.

In this case, it is preferable that any or all of the bipolar transistor, the field-effect transistor, the insulated gate bipolar transistor and the small-sized transformer are provided on the one surface of the first driving circuit board 32 that faces the second driving circuit board 40.

A front cover FC is provided so as to cover the heat dissipation sheet 60 and the PDP 600 provided on the one surface of the electrically conductive board 31, and a back cover BC is provided so as to cover the electrically conductive supports 34, the surface mount components 36, the first driving circuit board 32 and the electronic components 37 provided on the other surface of the electrically conductive board 31. Note that the front cover FC and the back cover BC are indicated by the broken lines in FIG. 4.

A lower end of the electrically conductive board 31 is fixed to an upper end of a supporting base 39. Thus, the supporting base 39 causes the plasma display device to stand along the vertical direction. That is, the PDP 600, the heat dissipation sheet 60, the electrically conductive board 31, the first driving circuit board 32 and the second driving circuit board 40 are arranged along the vertical direction, respectively.

A fan F is provided at an upper part of the electrically conductive board 31. The fan F sucks in an atmosphere from below and exhausts the atmosphere upwardly. This allows heat generated in a space between the electrically conductive board 31 and the first driving circuit board 32 to be released to the outside (the upper portion).

(1-d) Configuration of the Second Driving Circuit Board

Figure 5:
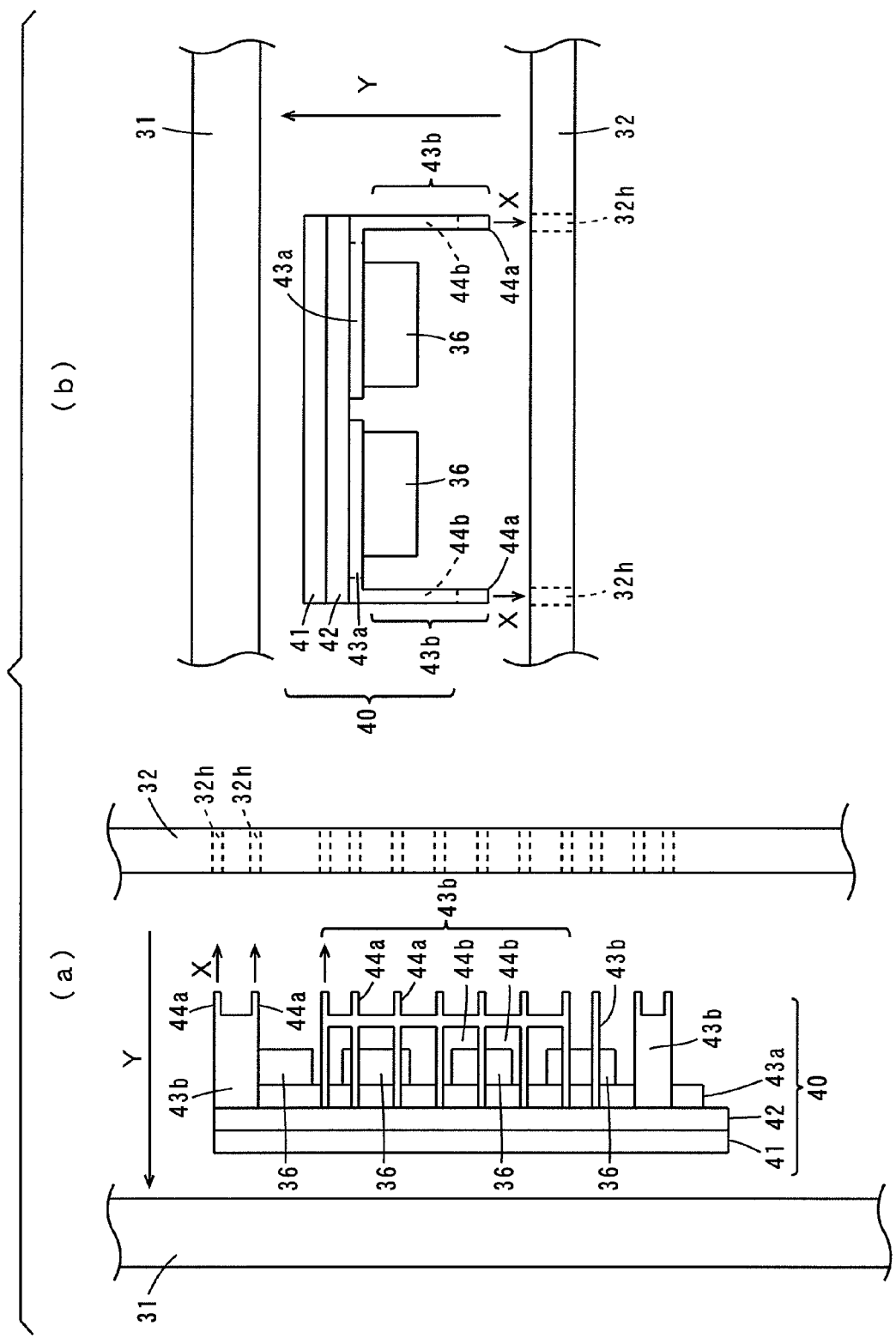
FIG. 5 is a diagram for explaining details of a configuration of a second driving circuit board of FIG. 4.

Here, details of a configuration of the second driving circuit board 40 are described. FIG. 5 is a diagram for explaining the details of the configuration of the second driving circuit board 40. An enlarged side view of the second driving circuit board 40 of FIG. 4 is shown in FIG. 5 (a), and an enlarged top view thereof is shown in FIG. 5 (b).

As shown in FIG. 5 (a) and FIG. 5 (b), the second driving circuit board 40 includes a reinforcement plate 41, an insulating layer 42 and a plurality of conductor layers 43a. The reinforcement plate 41 is composed of a material having the high thermal conductive property such as aluminum or steel, for example. This reinforcement plate 41 is positioned on the side of the electrically conductive board 31, and is in contact with the electrically conductive board 31.

An insulating layer 42 composed of insulating resin such as an inorganic filler is provided on the reinforcement plate 41. In addition, the plurality of conductor layers 43a composed of an electrically conductive material such as copper or silver is formed on the insulating layer 42. The plurality of conductor layers 43a have predetermined patterns. The above-described surface mount components 36 are mounted on the conductor layers 43a. Note that the conductor layers 43a have a thickness of about 0.8 mm, for example.

As shown in FIG. 5 (b), each of the conductor layers 43a is folded substantially vertically at both ends of the insulating layer 42 in a horizontal direction. Thus, the plurality of support terminals 43b are formed so as to substantially vertically extend with respect to the first driving circuit board 32 from the both ends of the insulating layer 42 in the horizontal direction. The plurality of support terminals 43b align in the vertical direction.

A plurality of openings 44b that align in the vertical direction are formed in parts of the support terminals 43b. These openings 44b allow the conductor layers 43a to be easily folded. A plurality of connectors 44a that project toward the first driving circuit board 32 are formed on the tips of the support terminals 43b. A plurality of terminal connection holes 32h are provided in positions, corresponding to the plurality of connectors 44a, of the first driving circuit board 32.

In the assembly of the plasma display device, the plurality of connectors 44a of the second driving circuit board 40 are inserted into the plurality of terminal connection holes 32h provided in the first driving circuit board 32. Accordingly, the second driving circuit board 40 can be attached to the first driving circuit board 32 (see the arrow X in FIG. 5 (a) and FIG. 5 (b)).

Then, the first driving circuit board 32 is attached to the electrically conductive board 31 by the electrically conductive supports 34 of FIG. 4 (see the arrow Y in FIG. 5 (a) and FIG. 5 (b)).

(1-e) Effects

In the plasma display device according to the present embodiment, the second driving circuit board 40 is provided on the one surface of the first driving circuit board 32 that faces the electrically conductive board 31. The one surface of the second driving circuit board 40 is in contact with the electrically conductive board 31, and the one or plurality of surface mount components 36 having the high heat-generating properties are mounted on the other surface of the second driving circuit board 40.

As described above, the surface mount components 36 are in contact with the electrically conductive board 31 with the second driving circuit board 40 sandwiched therebetween, so that the heat generated by the surface mount components 36 is efficiently transmitted to the electrically conductive board 31, and dissipated through the electrically conductive board 31. Thus, heat dissipation from the surface mount components 36 having the high heat-generating properties can be improved, and sufficient heat dissipation from the plasma display device can be ensured.

The electronic components 37 can be mounted on the one surface, which faces the second driving circuit board 40, of the first driving circuit board 32. This allows a mounting region for the electronic components 37 to be enlarged in the first driving circuit board 32.

Larger spacing between the electronic components 37 on the first driving circuit board 32 can improve heat dissipation from the electronic components 37. On the other hand, smaller spacing between the electronic components 37 on the first driving circuit board 32 can reduce the size of the first driving circuit board 32.

Thus, the size of the first driving circuit board 32 and the spacing between the electronic components 37 are appropriately set, so that size reduction of the first driving circuit board 32 and improvement of heat dissipation from the electronic components 37 can be achieved.

As described above, the spacing between the first driving circuit board 32 and the electrically conductive board 31 is set to be about 10-25 mm, for example, in the present embodiment.

When the spacing between the first driving circuit board 32 and the electrically conductive board 31 is set to be about 10 mm, sufficient reduction in thickness of the plasma display device can be achieved.

When the spacing between the first driving circuit board 32 and the electrically conductive board 31 is set to be about 25 mm, the electronic components 37 having a height of about not more than 25 mm can be mounted on the first driving circuit board 32 so as to face the second driving circuit board 40. This results in an enlarged mounting region for the electronic components 37 in the first driving circuit board 32.

In addition, the PDP 600 is provided so as to be in contact with the electrically conductive board 31 with the heat dissipation sheet 60 sandwiched therebetween, thereby dissipating not only the heat generated by the surface mount components 36 but also the heat generated by the PDP 600 through the electrically conductive board 31.

Figure 6:
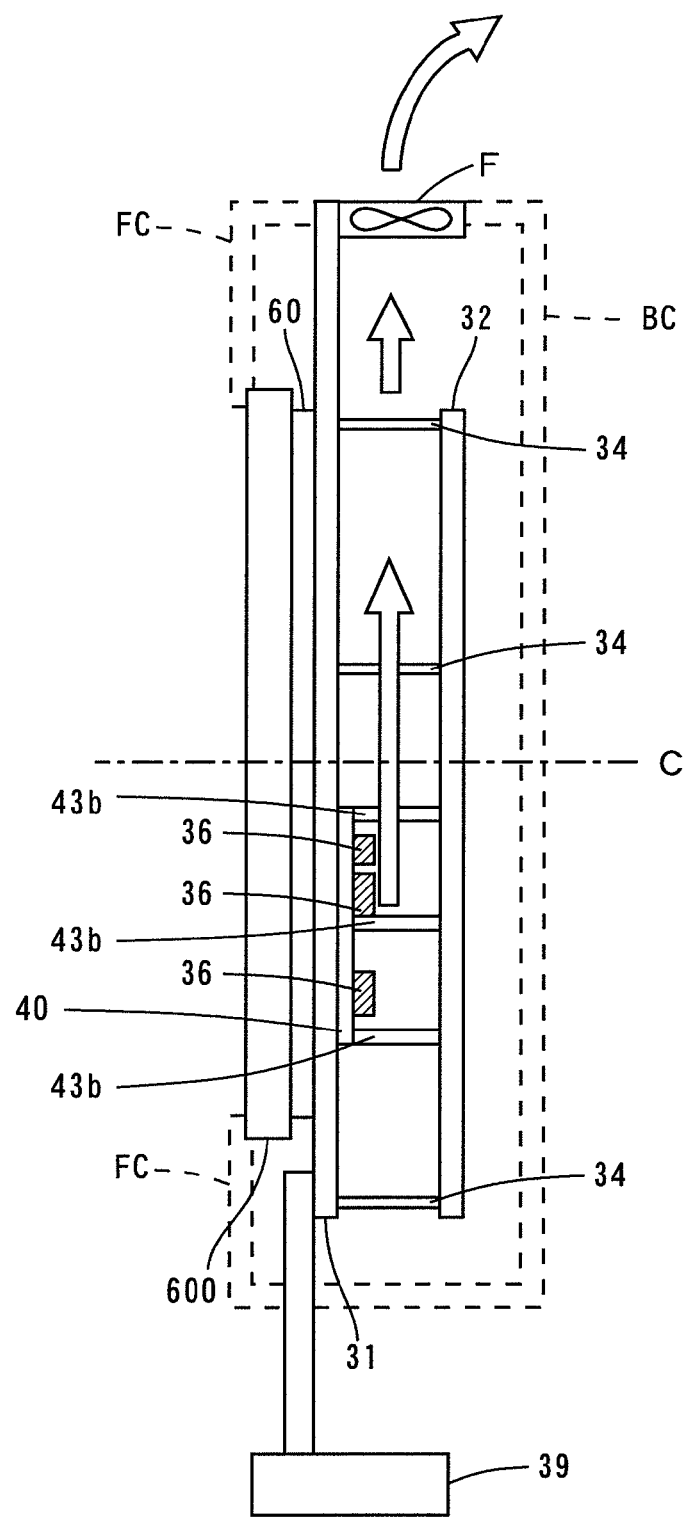
FIG. 6 is a diagram for explaining a flow of an atmosphere within the plasma display device of FIG. 4.

In the present embodiment, the second driving circuit board 40 is preferably provided at a part lower than the center of the plasma display device in the vertical direction. FIG. 6 is a diagram for explaining a flow of the atmosphere within the plasma display device of FIG. 4. Note that the electronic components 37 are omitted in FIG. 6.

The second driving circuit board 40 is provided at the part lower than the center (see the one-dot and dash line C) of the plasma display device in the vertical direction. In this case, the high-temperature atmosphere generated by the surface mount components 36 goes up while the fan F sucks in the atmosphere from below, thereby generating an upward airflow in the space between the electrically conductive board 31 and the first driving circuit board 32 as indicated by the arrow in FIG. 6.

Thus, the high-temperature atmosphere generated by not only the surface mount components 36 but also the electronic components 37 (not shown in FIG. 6) goes up in the space between the electrically conductive board 31 and the first driving circuit board 32.

Then, the atmosphere goes up in the space between the electrically conductive board 31 and the first driving circuit board 32 to be exhausted to the outside of the plasma display device through the fan F.

The plurality of support terminals 43b of the second driving circuit board 40 are formed so as to align along the vertical direction. This prevents the plurality of support terminals 43b from disturbing the upward airflow generated in the space between the electrically conductive board 31 and the first driving circuit board 32. As a result, the high-temperature atmosphere smoothly flows without being affected by the support terminals 43b, so that sufficient heat dissipation from the surface mount components 36 and the electronic components 37 in the plasma display device is ensured.

(2) Second Embodiment

A plasma display device according to a second embodiment is different from the plasma display device according to the first embodiment in the following points.

Figure 7:
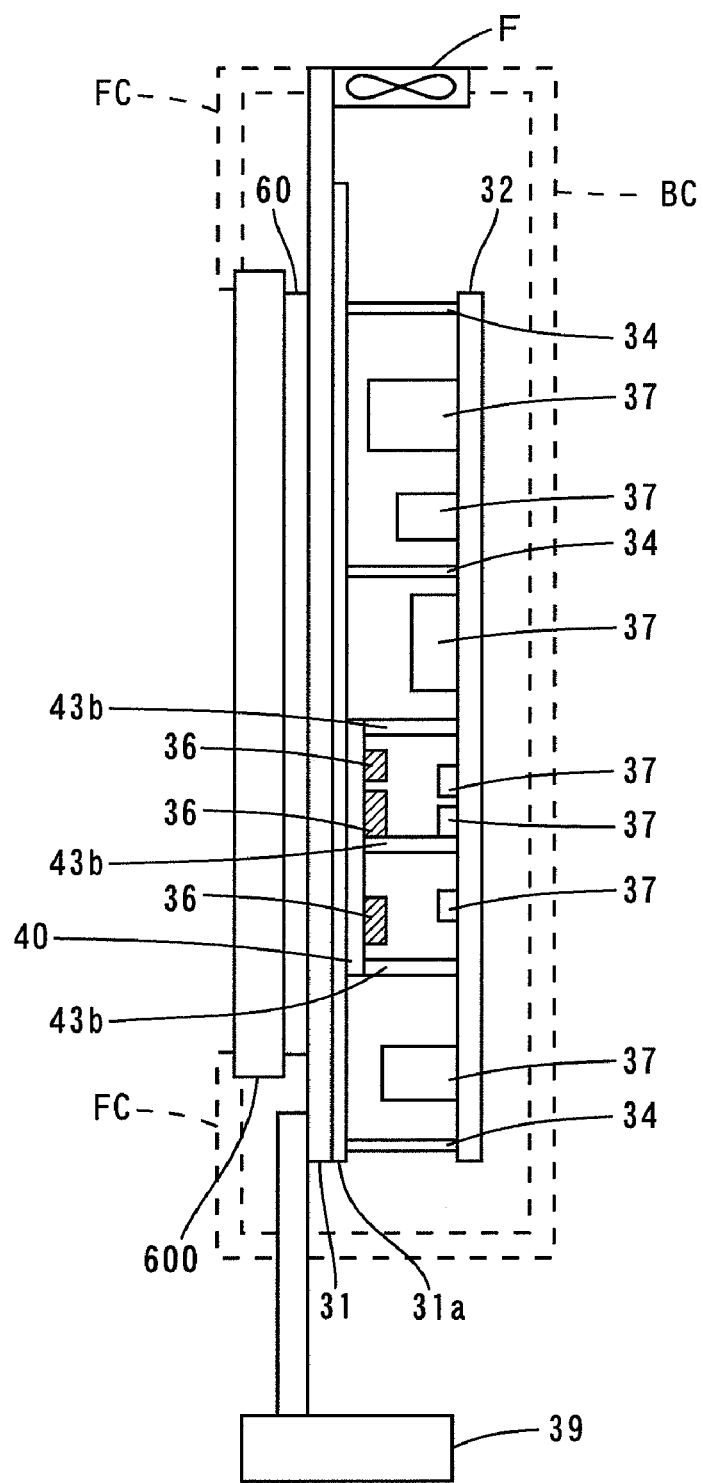
FIG. 7 is a side view showing a plasma display device according to a second embodiment.

FIG. 7 is a side view showing the plasma display device according to the second embodiment.

As shown in FIG. 7, a thermal conductive member 31a including one or both of a high thermal conductive sheet made of silicone rubber, a carbon sheet or the like and a high thermal conductive adhesive liquid made of a silicone liquid, putty, a carbon liquid or the like, for example, may be provided between the electrically conductive board 31 and the second driving circuit board 40. Thus, heat dissipation from the surface mount components 36 can be further improved.

(3) Third Embodiment

A plasma display device according to a third embodiment is different from the plasma display device according to the first embodiment in the following points.

FIG. 8 is a side view showing the plasma display device according to the third embodiment. As shown in FIG. 8, the one or plurality of electronic components 37 are mounted on the other surface, on the side opposite to the electrically conductive board 31, of the first driving circuit board 32 in the plasma display device according to the present embodiment.

In this case, the heights of the electronic components 37 are not limited by the spacing between the electrically conductive board 31 and the first driving circuit board 32, thereby easing the limitation in size of the electronic components 37 used in the plasma display device. This broadens a range of selections for the electronic components 37. Larger mounting spacing between the electronic components 37 on the first driving circuit board 32 can improve heat dissipation from the electronic components 37. On the other hand, smaller mounting spacing between the electronic components 37 on the first driving circuit board 32 can achieve size reduction of the first driving circuit board 32.

Thus, the size of the first driving circuit board 32 and the spacing between the electronic components 37 are appropriately set, so that size reduction of the first driving circuit board 32 and improvement of heat dissipation from the electronic components 37 can be achieved.

In the plasma display device according to the third embodiment, the electronic components 37 may be additionally mounted on the one surface, which faces the electrically conductive board 31, of the first driving circuit board 32 as indicated by the dotted line in FIG. 8.

In this case, since the one or plurality of electronic components 37 can be mounted on the both surfaces of the first driving circuit board 32, the mounting region for the electronic components 37 in the first driving circuit board 32 is further enlarged.

Larger mounting spacing between the electronic components 37 on the first driving circuit board 32 can further improve heat dissipation from the electronic components 37. On the other hand, smaller mounting spacing between the electronic components 37 on the first driving circuit board 32 can achieve further size reduction of the first driving circuit board 32.

Thus, the size of the first driving circuit board 32 and the spacing between the electronic components 37 are appropriately set, so that further size reduction of the first driving circuit board 32 and further improvement of heat dissipation from the electronic components 37 can be achieved.

(4) Modifications of the Plasma Display Device According to the First-Third Embodiments In the first-third embodiments, it is not necessarily required that only the surface mount components 36 are mounted on the second driving circuit board 40. The electronic components 37 having the heights lower than the support terminals 43b can also be mounted on the second driving circuit board 40. In this case, the mounting region for the electronic components 37 in the first driving circuit board 32 is enlarged.

Larger mounting spacing between the electronic components 37 on the first driving circuit board 32 can improve heat dissipation from the electronic components 37. On the other hand, smaller mounting spacing between the electronic components 37 on the first driving circuit board 32 can achieve size reduction of the first driving circuit board 32.

In the first-third embodiments, the plasma display device may not include the fan F of FIG. 4. In this case, an opening is formed at, for example, an upper part of the back cover that is not shown. Accordingly, the high-temperature atmosphere generated within the plasma display device goes up with the upward airflow generated in the space between the electrically conductive board 31 and the first driving circuit board 32, and is exhausted to the outside through the opening of the back cover. As a result, cost reduction of the plasma display device can be achieved.

The electrically conductive board 31 may be used as current paths of driving circuits provided in the scan driver 800 and the sustain driver 900, respectively, and the electrically conductive supports 34 may be used as the current paths of the driving circuits provided in the scan driver 800 and the sustain driver 900, respectively.

(5) Fourth Embodiment

A plasma display device according to a fourth embodiment is different from the plasma display device according to the first embodiment in the following points.

(5-a) Configuration of the Plasma Display Device

Figure 9:
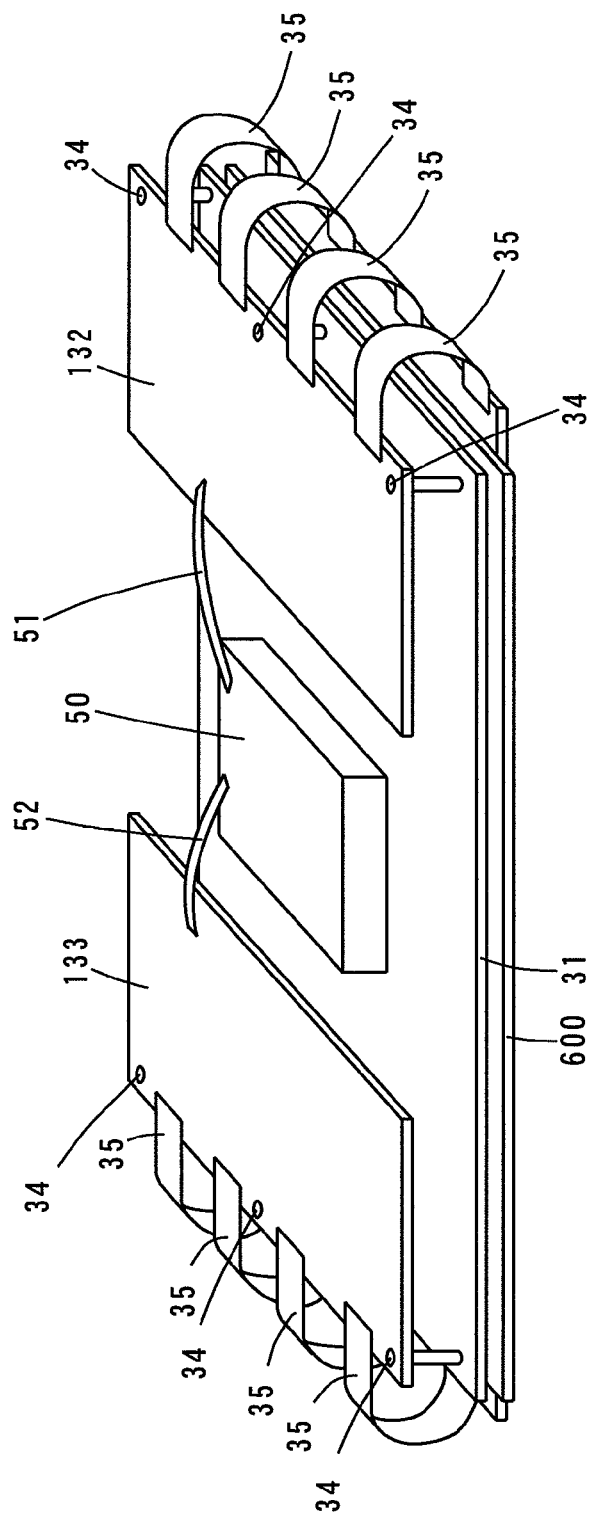
FIG. 9 is a perspective view showing the appearance of a plasma display device according to a fourth embodiment.

FIG. 9 is a perspective view showing the appearance of the plasma display device according to the fourth embodiment.

As show in FIG. 9, the electrically conductive board (panel support) 31 made of, for example, aluminum, steel or the like is bonded to the PDP 600 with the heat dissipation sheet (shown in a diagram described later) sandwiched therebetween. Note that the PDP 600 includes the plurality of scan electrodes 11a and the plurality of sustain electrodes 11b of FIG. 1.

Driving circuit boards 132, 133 are fixed on the electrically conductive board 31 by the plurality of electrically conductive supports (bosses) 34, respectively. Note that the various kinds of surface mount components and the various kinds of electronic components, described later, to be mounted on surfaces of the driving circuit boards 132, 133 are not shown in FIG. 9. The driving circuit boards 132, 133 are connected to the scan electrodes 11a and the sustain electrodes 11b of the PDP 600, respectively, by the respective plurality of flexible connection boards 35 as the wiring boards.

The power supply circuit 50 and the fan, which is not shown, are provided on the electrically conductive board 31. The power supply circuit 50 is connected to the driving circuit board 132 by the wiring member 51 while being connected to the driving circuit board 133 by the wiring member 52.

Next, the various kinds of surface mount components and the various kinds of electronic components to be mounted on the surfaces of the driving circuit boards 132, 133 are explained.

Figure 10:
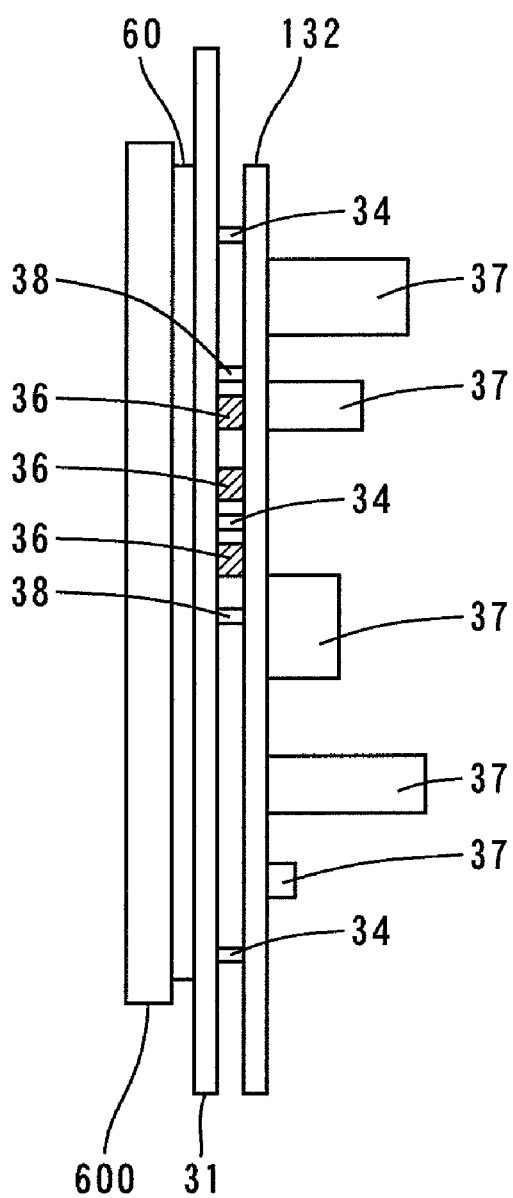
FIG. 10 is a side view showing the plasma display device of FIG. 9.

FIG. 10 is a side view showing the plasma display device of FIG. 9. Note that in FIG. 10, the plasma display device that is seen from the side of the driving circuit board 132 is shown, and a part thereof is omitted. While a configuration of the driving circuit board 132 is described as one typical example in the following, a configuration of the driving circuit board 133 is similar to the configuration of the driving circuit board 132.

As shown in FIG. 10, the PDP 600 is attached to the electrically conductive board 31 with the heat dissipation sheet 60 sandwiched therebetween. The driving circuit board 132 is fixed on the electrically conductive board 31 by the plurality of electrically conductive supports 34 as described above. The spacing between the driving circuit board 132 and the electrically conductive board 31 is not more than 10 mm, for example.

In the present embodiment, the one or plurality of surface mount components 36 are mounted on the surface, on the side of the electrically conductive board 31, of the driving circuit board 132. In this case, the one or plurality of surface mount components 36 having the heights of not more than 10 mm are mounted on the above-described surface of the driving circuit board 132 so as to be in contact with or in proximity to the electrically conductive board 31.

The above-described surface mount components 36 have the high heat-generating properties, and include, for example, a bipolar transistor, a field-effect transistor, an insulated gate bipolar transistor, a diode, a small-sized transformer or the like.

As for the bipolar transistor and the insulated gate bipolar transistor, a collector fin is bonded to the surface of the driving circuit board 132 with the solder while a terminal thereof is connected to the wiring pattern of the driving circuit board 132 with the solder.

As for the field-effect transistor, a drain fin is bonded to the surface of the driving circuit board 132 with the solder while a terminal is connected to the wiring pattern of the driving circuit board 132 with the solder.

As for the diode, a cathode fin is bonded to the surface of the driving circuit board 132 with the solder while a terminal is connected to the wiring pattern of the driving circuit board 132 with the solder.

On the other hand, the one or plurality of electronic components 37 are provided on the surface, on the opposite side to the electrically conductive board 31, of the driving circuit board 132. The above-described electronic components 37 have the relatively low heat-generating properties, and the heights thereof are relatively high (not less than 10 mm, for example). The electronic components 37 include, for example, a control integrated circuit (control IC), a coil, a resistor, a variable resistor, a small-signal transistor, a capacitor, an inductor, a transformer, a photocoupler or the like.

In the present embodiment, the one or plurality of surface mount components 36 are mounted at the center portion of the driving circuit board 132 so as to be reliably in contact with or more in proximity to the electrically conductive board 31, and in the vicinity of side portions thereof, the driving circuit board 132 and the electrically conductive board 31 are fixed to each other by a plurality of screws 38.

The front cover, not shown, is provided so as to cover the heat dissipation sheet 60 and the PDP 600 provided on the one surface of the electrically conductive board 31, and the back cover, not shown, is provided so as to cover the electrically conductive supports 34, the surface mount components 36, the screws 38, the driving circuit board 132 and the electronic components 37 provided on the other surface of the electrically conductive board 31.

(5-b) Effects

In the present embodiment, the one or plurality of surface mount components 36 having the high heat-generating properties are mounted on the surface, on the side of the electrically conductive board 31, of the driving circuit board 132 and the surface mount components 36 are in contact with or in proximity to the electrically conductive board 31, resulting in sufficient heat dissipation from the surface mount components 36 by the electrically conductive board 31.

In addition, equal heights of the one or plurality of surface mount components 36 can cause better contact between the surface mount components 36 and the electrically conductive board 31, allowing heat dissipation to be further improved.

Moreover, the one or plurality of surface mount components 36 are mounted at the center of the driving circuit board 132 so as to be reliably in contact with or in proximity to the electrically conductive board 31, and the driving circuit board 132 and the electrically conductive board 31 are fixed to each other by the plurality of screws 38 in the vicinity of the side portions thereof, so that better contact between the surface mount components 36 and the electrically conductive board 31 can be obtained. This allows heat dissipation to be further improved.

Furthermore, the PDP 600 is provided so as to be in contact with the electrically conductive board 31 with the heat dissipation sheet 60 sandwiched therebetween, so that the heat from not only the surface mount components 36 but also the PDP 600 can be dissipated through the electrically conductive board 31.

In addition, the one or plurality of surface mount components 36 are mounted on the surface, on the side of the electrically conductive board 31, of the driving circuit board 132, so that a region for arrangement of the electronic components 37 that are provided on the surface, on the opposite side to the electrically conductive board 31, of the driving circuit board 132 is enlarged.

Furthermore, since a radiator that radiates heat to the outside is not required in the plasma display device of the present embodiment, cost reduction can be achieved.

(6) Another Embodiment

The plasma display device according to another embodiment is different from the plasma display device according to the fourth embodiment in the following points.

Figure 11:
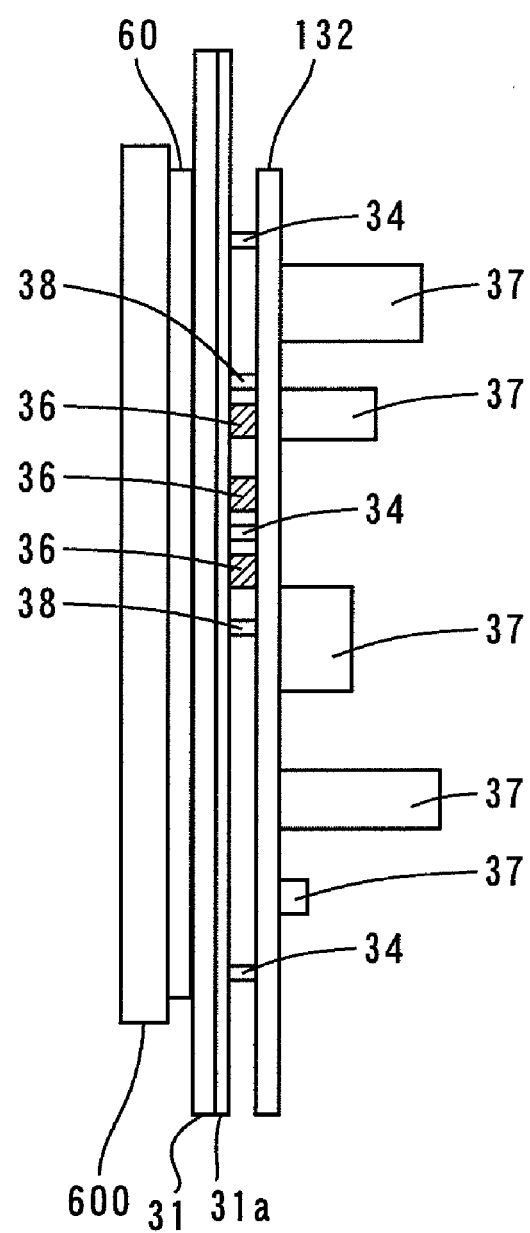
FIG. 11 is a side view showing a plasma display device according to another embodiment.
Figure 12:
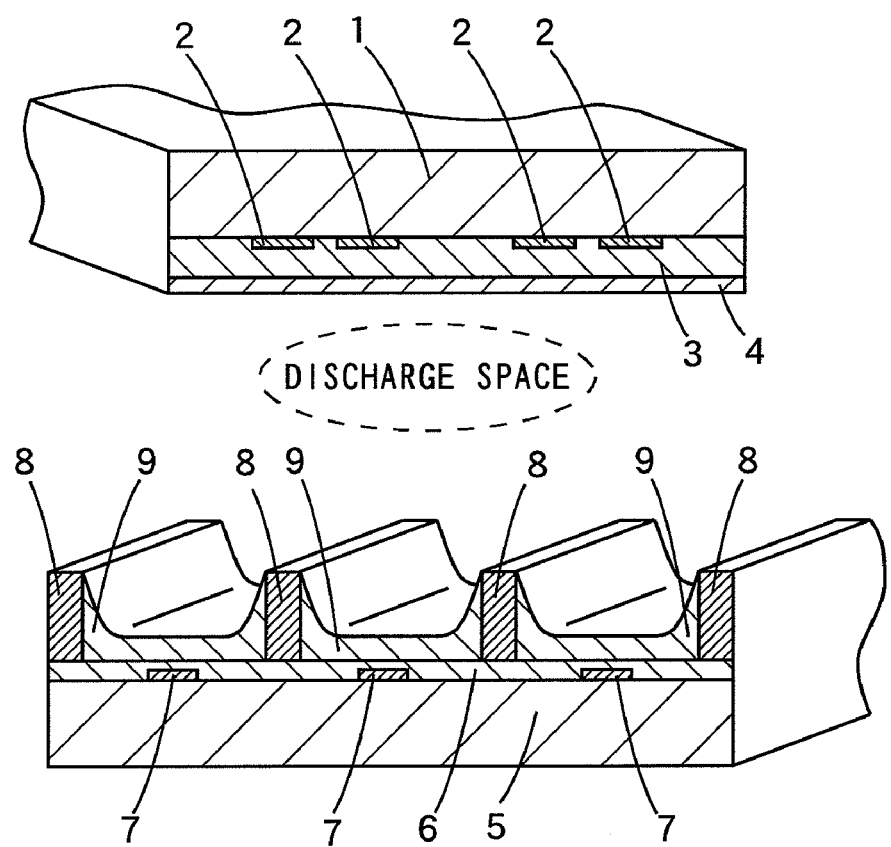
FIG. 12 is a schematic view showing a configuration of a plasma display panel of a plasma display device.

FIG. 11 shows a side view of the plasma display device according to another embodiment.

As shown in FIG. 11, the thermal conductive member 31a including one or both of a high thermal conductive sheet made of silicone rubber, a carbon sheet or the like and a high thermal conductive adhesive liquid made of a silicone liquid, putty or the like, for example, may be provided between the electrically conductive board 31 and the surface mount components 36. This can further improve heat dissipation from the surface mount components 36.

While the electronic components 37 are provided on the surface, on the opposite side to the electrically conductive board 31, of the driving circuit board 132 in the above-described fourth embodiment, the present invention is not limited to this. Part or all of the electronic components 37 may be provided on the surface, on the side of the electrically conductive board 31, of the driving circuit board 132 if it is possible to arrange them in a space between the electrically conductive board 31 and the driving circuit board 132.

The electrically conductive board 31 may be used as current paths of the driving circuits provided in the scan driver 800 and the sustain driver 900, respectively, and the electrically conductive supports 34 may be used as current paths of the driving circuits provided in the scan driver 800 and the sustain driver 900, respectively.

Although all of the surface mount components 36 are provided on the surface, on the side of the electrically conductive board 31, of the driving circuit board 132 in the above-described fourth embodiment, the present invention is not limited to this. Part of the surface mount components 36 may be provided on the surface, on the opposite side to the electrically conductive board 31, of the driving circuit board 132 if sufficient heat dissipation can be ensured. In this case, any of a bipolar transistor, a field-effect transistor, an insulated gate bipolar transistor or a small-sized transformer is preferably provided on the surface, on the side of the electrically conductive board 31, of the driving circuit board 132.

(7) Correspondences Between Elements in the Claims and Parts in Embodiments

In the following paragraphs, non-limiting examples of correspondences between various elements recited in the claims below and those described above with respect to various preferred embodiments of the present invention are explained.

(7-a)

The plasma display device according to the first-third embodiments corresponds to a plasma display device of claims 1-10.

In the first-third embodiments, the PDP 600 corresponds to a plasma display panel, the electrically conductive board 31 corresponds to a supporting board, and the electrically conductive support 34 corresponds to a coupling member.

The support terminal 43b corresponds to a connecting member, the fan F corresponds to an airflow forming device, the heat dissipation sheet 60 corresponds to a heat dissipation member, the surface, on the side of the electrically conductive board 31, of the first driving circuit board 32 corresponds to a first surface, and the surface, on the opposite side to the electrically conductive board 31, of the first driving circuit board 32 corresponds to a second surface.

The first driving circuit board 32 corresponds to a first scan driving circuit board, the first driving circuit board 33 corresponds to a first sustain driving circuit board, the second driving circuit board 40 corresponds to a second scan driving circuit board and a second sustain driving circuit board, the driving circuit including the surface mount component 36 and the electronic component 37 corresponds to a driving circuit, a first driving circuit and a second driving circuit.

The surface, on the side of the electrically conductive board 31, of the first driving circuit board 33 corresponds to a third surface, and the surface, on the opposite side to the electrically conductive board 31, of the first driving circuit board 33 corresponds to a fourth surface.

(7-b)

The plasma display device according to the fourth embodiment and another embodiment corresponds to a plasma display device of claims 11-15.

In the fourth embodiment and another embodiment, the PDP 600 corresponds to a plasma display panel, the driving circuit boards 132, 133 correspond to first and second driving circuit boards, respectively, the electrically conductive board 31 corresponds to a supporting board, the surface mount component 36 corresponds to a driving circuit and first and second driving circuits, the electrically conductive support 34 corresponds to a joining member and the heat dissipation sheet 60 corresponds to a heat dissipation member.

In the fourth embodiment and another embodiment, the surface, on the side of the electrically conductive board 31, of the driving circuit board 132 corresponds to a first surface, the surface, on the opposite side to the electrically conductive board 31, of the driving circuit board 132 corresponds to a second surface, the surface, on the side of the electrically conductive board 31, of the driving circuit board 133 corresponds to a third surface, and the surface, on the opposite side to the electrically conductive board 31, of the driving circuit board 133 corresponds to a fourth surface.

INDUSTRIAL APPLICABILITY

The present invention is applicable to display of various videos.

The invention claimed is:

1. A plasma display device, comprising:
a plasma display panel;
a supporting board that supports said plasma display panel;
a first driving circuit board having a first surface and a second surface;
a coupling member that couples said supporting board and said first driving circuit board with each other and is positioned between one surface of said supporting board and said first surface of said first driving circuit board;
a thermal conductive member that is provided between said supporting board and said first driving circuit board so as to be in contact with said supporting board;
a second driving circuit board that is arranged between said supporting board and said first driving circuit board so as to be in contact with said thermal conductive member; and
one or plurality of driving circuits that are mounted on said first and second driving circuit boards and supply drive currents to said plasma display panel, wherein
said second driving circuit board is supported on said first driving circuit board by an electrically conductive connecting member,
said drive currents are supplied from said second driving circuit board to said first driving circuit board through said electrically conductive connecting member, and
said connecting member includes terminals and wirings of said one or plurality of driving circuits that are aligned in a vertical direction.

2. The plasma display device according to claim 1, wherein said plasma display panel, said supporting board, said first driving circuit board and said second driving circuit board are arranged along a substantially vertical direction,
said connecting member includes a plurality of connecting members, and
said plurality of connecting members are arranged so as to align in a vertical direction.

3. The plasma display device according to claim 1, wherein said second driving circuit board is arranged at a part lower than a center of said plasma display panel.

4. The plasma display device according to claim 1, further comprising an airflow forming device that forms an airflow between said supporting board and said first driving circuit board.

5. The plasma display device according to claim 1, further comprising a heat dissipation member between said plasma display panel and said supporting board.

6. The plasma display device according to claim 1, wherein said one or plurality of driving circuits are provided in a region, which faces said second driving circuit board, on said first surface of said first driving circuit board.

* * * * *